(12) United States Patent
Nishizaki et al.

(10) Patent No.: US 9,207,277 B2
(45) Date of Patent: Dec. 8, 2015

(54) SYSTEM AND METHOD FOR GENERATING A YIELD FORECAST BASED ON WAFER ACCEPTANCE TESTS

(71) Applicant: Nvidia Corporation, Santa Clara, CA (US)

(72) Inventors: Craig Nishizaki, Santa Clara, CA (US); Peter Hung, Santa Clara, CA (US); Gunaseelan Ponnuvel, Santa Clara, CA (US); Chien-Hsiung Peng, Santa Clara, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 561 days.

(21) Appl. No.: 13/663,644

(22) Filed: Oct. 30, 2012

(65) Prior Publication Data

US 2014/0122005 A1     May 1, 2014

(51) Int. Cl.
| | |
|---|---|
| *G06Q 90/00* | (2006.01) |
| *G07C 3/08* | (2006.01) |
| *G01D 21/00* | (2006.01) |
| *G06M 11/00* | (2006.01) |
| *G06Q 50/04* | (2012.01) |
| *G01R 31/28* | (2006.01) |

(52) U.S. Cl.
CPC .......... *G01R 31/2894* (2013.01); *G06Q 50/04* (2013.01); *G06Q 90/00* (2013.01); *G01D 21/00* (2013.01); *G06M 11/00* (2013.01); *G07C 3/08* (2013.01)

(58) Field of Classification Search
None
See application file for complete search history.

(56) References Cited

U.S. PATENT DOCUMENTS

2014/0358478 A1\* 12/2014 Yu ........................... H01L 22/20
702/181

\* cited by examiner

*Primary Examiner* — Edward Cosimano

(57) ABSTRACT

A wafer acceptance test (WAT) system and method that, in one embodiment, includes: (1) a saturation current WAT subsystem operable to generate a weighted standard deviation based on target NMOS and PMOS saturation currents and saturation current WAT results, (2) a wafer IC speed WAT subsystem operable to generate a speed performance probability distribution of wafer ICs based on the weighted standard deviation and speed WAT results, (3) a wafer IC power WAT subsystem operable to employ the speed WAT results and power WAT results to generate a power performance model of wafer ICs, and (4) a yield calculator operable to generate a power performance variance probability distribution of wafer ICs based on the power performance model and the power WAT results, and to employ the speed performance probability distribution and the power performance variance probability distribution to generate the yield forecast with respect to a target performance profile.

20 Claims, 4 Drawing Sheets

SYSTEM AND METHOD FOR GENERATING A YIELD FORECAST BASED ON WAFER ACCEPTANCE TESTS

TECHNICAL FIELD

This application is directed, in general, to wafer acceptance tests (WATs) and, more specifically, to WATs that may be used to forecast yield.

BACKGROUND

Wafer fabrication is the process by which integrated circuits (ICs) are manufactured. It is basically a process by which a silicon wafer substrate is repeatedly coated, etched and rinsed to form ICs. The wafer is then cut to separate the ICs, which may then be molded into packages for mounting on circuit boards or the like.

Wafer fabrication is a multivariate process and subject to manufacturing defects, however slight they may be. A highly competitive wafer fabrication industry pays a great deal of attention to the occurrence and impact of these defects, the most extreme of which can lead to a wafer batch being scrapped entirely. Accordingly, the industry has developed a multitude of WATs that narrowly identify sub-optimal wafer fabrication. Initially, WATs were used to allow manufacturers to determine whether or not to accept a lot of completed wafers into inventory as sellable products. Over time, WATs began to be used to allow manufacturers to direct their wafer manufacturing and inventory more precisely.

The wafer fabrication industry is largely demand-driven. Consequently, wafer fabrication tends to be carried out with specific end products in mind. As such, a premium is placed on an understanding of precisely how a certain batch or lot of wafers will perform.

SUMMARY

One aspect provides a WAT system for generating a yield forecast based on an WAT of a wafer IC batch, including: (1) a saturation current WAT subsystem operable to generate a weighted standard deviation based on target NMOS and PMOS saturation currents and saturation current WAT results, (2) a wafer IC speed WAT subsystem operable to generate a speed performance probability distribution of wafer ICs based on the weighted standard deviation and speed WAT results, (3) a wafer IC power WAT subsystem operable to employ the speed WAT results and power WAT results to generate a power performance model of wafer ICs, and (4) a yield calculator operable to generate a power performance variance probability distribution of wafer ICs based on the power performance model and the power WAT results, and to employ the speed performance probability distribution and the power performance variance probability distribution to generate the yield forecast with respect to a target performance profile.

Another aspect provides a method for generating a yield forecast for a wafer batch based on an WAT of a plurality of semiconductor devices forming a plurality of ICs in the wafer batch, including: (1) measuring saturation currents of the plurality of semiconductor devices, (2) calculating weighted standard deviation of the saturation currents with respect to target n-type metal-oxide semiconductor (NMOS) and p-type metal-oxide semiconductor (PMOS) saturation currents, (3) measuring speed performances of the plurality of ICs and generating a speed performance model, (4) measuring power performances of the plurality of ICs and generating a power performance model, (5) projecting distributions among the plurality of ICs of speed performances and variations from the power performance model, and (6) integrating one of the distributions about a target performance profile to generate the yield forecast.

Yet another aspect provides a system for generating a yield forecast based on an WAT of a wafer IC batch, including: (1) a saturation current WAT automated test equipment (ATE) operable to measure PMOS and NMOS saturation currents of semiconductor devices within an IC, (2) a wafer IC speed WAT ATE operable to determine speed performance of the IC, (3) a wafer IC power WAT ATE operable to determine power performance of the IC, and (4) a yield calculator operable to employ the PMOS and NMOS saturation currents, the speed performance and the power performance for each IC in the wafer IC batch to generate the yield forecast, the yield calculator having: (4a) a first program configured to generate a speed performance distribution, (4b) a second program configured to generate a power performance variance distribution, and (4c) a third program configured to employ the speed performance distribution and the power performance distribution to generate the yield forecast.

BRIEF DESCRIPTION

Reference is now made to the following descriptions taken in conjunction with the accompanying drawings, in which.

DETAILED DESCRIPTION

Figure 1:
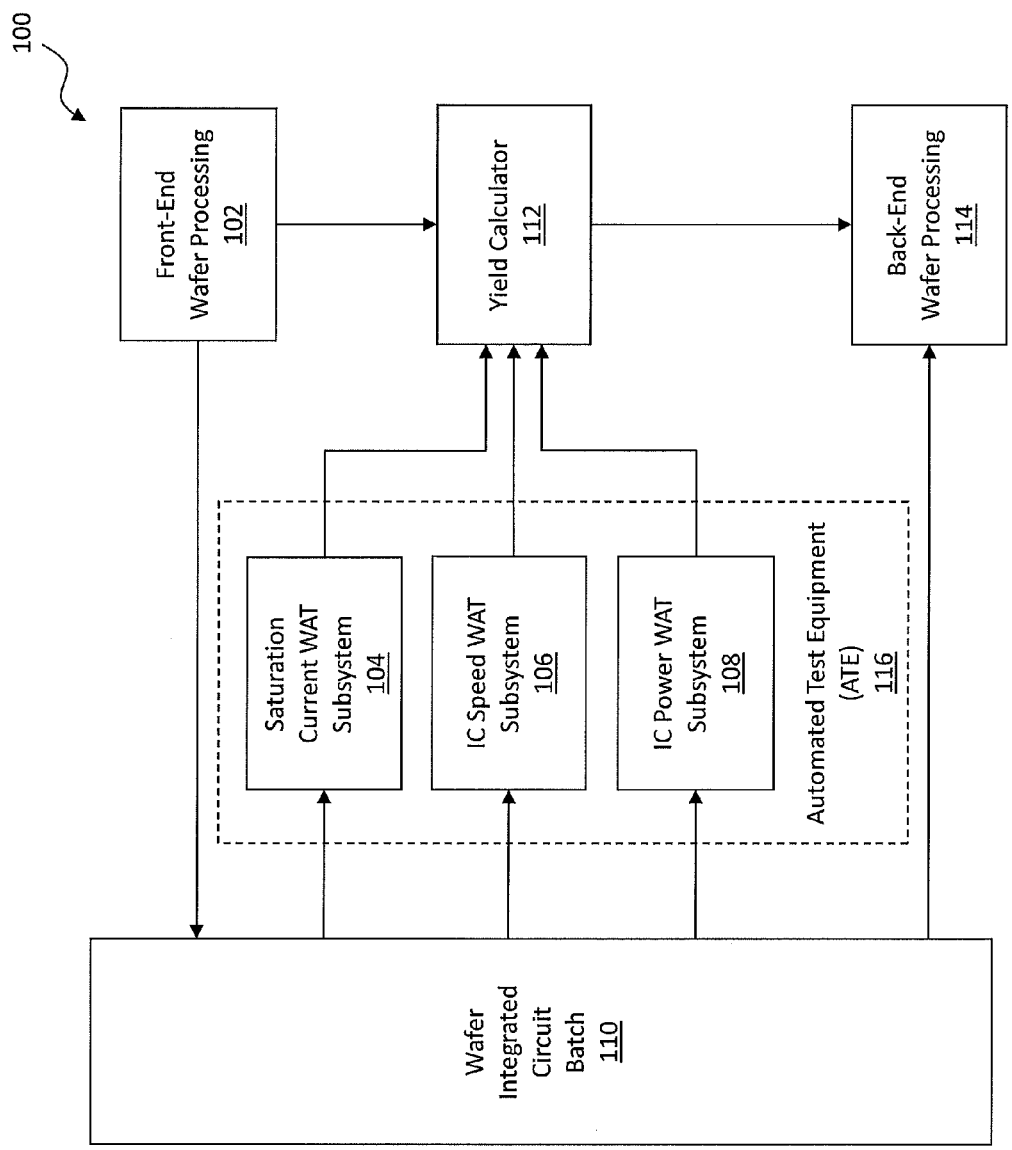
FIG. 1 is a block diagram of one embodiment of a WAT system.

Before describing various embodiments of the WAT system or method introduced herein, WAT processes and yield forecasting will be generally described.

Traditional wafer fabrication yield is determined by evaluating finished wafers and allocating each to a performance bin that characterizes the products or applications wafers in that bin are valid and qualified to serve. The evaluations are known as wafer acceptance tests or WATs. Performance bins are generally formed to fit a specific product and are often defined with upper and lower bounds on a physical, often electrical, characteristic. For example, signal processing applications require good noise resistance. Another example is mobile devices, which require substantially low-power ICs. Production of many wafer batches over time lends statistical data for wafer manufacturers to predict yield of future batches.

Alternatively, wafer manufacturers may rely on WATs as the basis for forecasting the ultimate yield of a batch. At some point during the manufacturing process, wafers are subjected to several WATs carried out by ATE. ATE is a general category of testing equipment and can be a variety of devices, ranging from simple digital multi-meters to spectrum analyzers and possibly even complex testing software, or any combination of those. The primary product of the ATE is data, and more relevantly, performance data. The ATE data can be analyzed and statistical models formed to make more informed yield forecasts before the final wafers roll off the manufacturing line.

It is fundamentally realized herein that certain correlations exist between ATE data and final performance characteristics of fully fabricated wafer ICs. It is further realized herein that a novel, advanced WAT system can exploit these correlations by performing the analysis and forming the predictions necessary to generate a more precise wafer yield prediction.

It is realized herein that a linear relationship exists between a weighted standard deviation of saturation currents relative to target saturation currents for NMOS and PMOS devices in the ICs of a wafer, and speed performance of the ICs. It is further realized herein that a strong correlation exists between speed performance of ICs and final speed performance, making speed WATs fair indicators of yield with respect to IC speed requirements.

It is also realized herein that an exponential relationship exists between speed performance and power performance. It is further realized that a strong correlation exists between power performance and final power performance, making power WATs also fair indicators of yield with respect to IC power requirements. It is further realized that when IC requirements dictate both speed and power performance, a combination of the statistical forecasts is also valid.

It is realized herein that a probability distribution based on speed performance versus the weighted standard deviation of saturation currents provides a sufficient mechanism to forecast yield with respect to a target speed performance. It is also realized herein that the power performance correlation may be further exploited by considering the variation in power performance from the statistical trend. It is further realized herein once the variation is linearized, a probability distribution based on the variation versus speed performance also provides a sufficient mechanism to forecast yield with respect to a target power performance.

It is realized herein the more precise yield forecast fosters a more efficient wafer fabrication process. It is also realized herein the forecasts allow manufacturers to plan and better utilize wafer inventory by having a more precisely defined wafer product. It is further realized herein the forecast provides for earlier wafer product validation and qualification. It is still further realized herein manufacturers may prioritize further wafer fabrication based on the yield forecast.

Having generally described WAT processes and yield forecasting, various embodiments of the WAT system and method introduced herein will be described.

FIG. 1 is a block diagram of one embodiment of a WAT system 100 in which one or more aspects of the invention may be implemented. The WAT system 100 includes a bisected wafer manufacturing process, beginning with front-end wafer processing 102 and finishing with back-end wafer processing 114. Alternate embodiments include many stages of processing, or possibly even a single stage. The embodiment of FIG. 1 is a generalization of wafer manufacturing. Front-end wafer processing 102 produces a wafer IC batch 110 that is then subjected to a variety of WATs, carried out on ATE 116, before carrying out back-end wafer processing 114.

The ATE 116 of FIG. 1 includes a saturation current WAT subsystem 104, an IC speed WAT subsystem 106 and an IC power WAT subsystem 108. Each of those subsystems provides data to a yield calculator 112 that generates a yield forecast. The yield forecast is used to direct back-end wafer processing 114.

In alternate embodiments, the ATE 116 may contain a variety of other subsystems, including: a logic analyzer subsystem, a spectrum analyzer subsystem, an electromagnetic field (EMF) WAT subsystem and many others.

Figure 2:
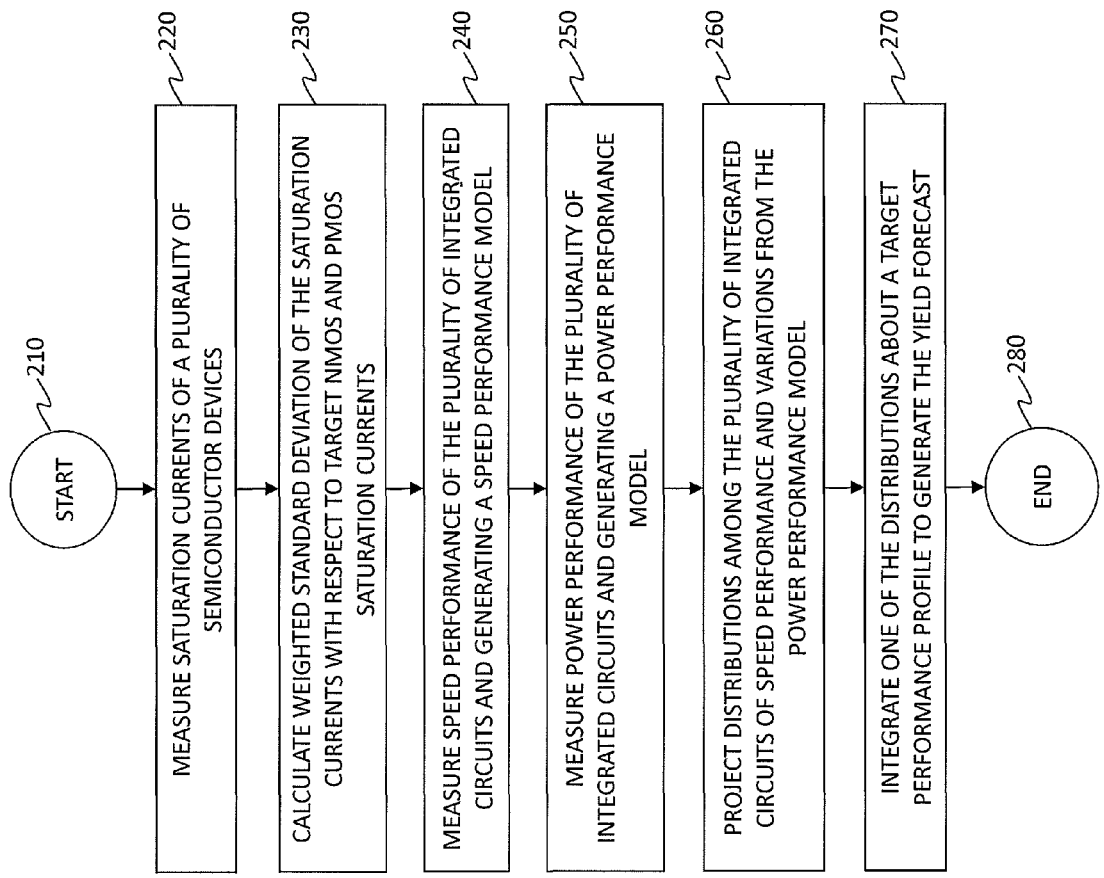
FIG. 2 is a flow diagram of one embodiment of a method of generating a yield forecast based on WAT.

FIG. 2 is a flow diagram of one embodiment of a method of generating a yield forecast based on WAT. The method begins at a start step 210 and continues on to step 220 where saturation currents are measured for various NMOS and PMOS devices within the ICs of the wafer batch. The measured saturation currents inevitably vary from target NMOS and PMOS saturation currents for the wafer batch. This variance is captured in a weighted standard deviation of the measured saturation currents with respect to the target saturation currents, calculated at step 230. The speed performances of the ICs in the wafer batch are measured and a speed performance model generated at step 240. Similarly, at step 250, the power performances of the ICs are measured and a power performance model generated. Two distributions of ICs are projected at step 260. The first is a distribution of speed performance among the ICs based on the statistical speed performance as a function of the weighted standard deviation calculated at step 230 revealed by the WAT measurements. The second is a distribution of variance in power performance from the power performance model generated at step 250. The second distribution is based on the statistical variance in measured power performance as a function of the speed performance measured at step 240. One of the two distributions from step 260 is then employed in an integration step 270 to generate a yield forecast before ending at step 280. If target wafer characteristics concern speed performance, then the speed performance distribution is integrated over some tolerance band about a target speed performance. Likewise, if target wafer characteristics concern power performance, then the power performance variance distribution is integrated about a target power performance.

Alternate embodiments may employ both distributions in forecasting yield with respect to a desired relationship between speed performance and power performance. Other embodiments may simply require a power or speed threshold be satisfied. In all these embodiments, the bounds of the integration are adjusted to encompass the target performance characteristics.

Figure 3:
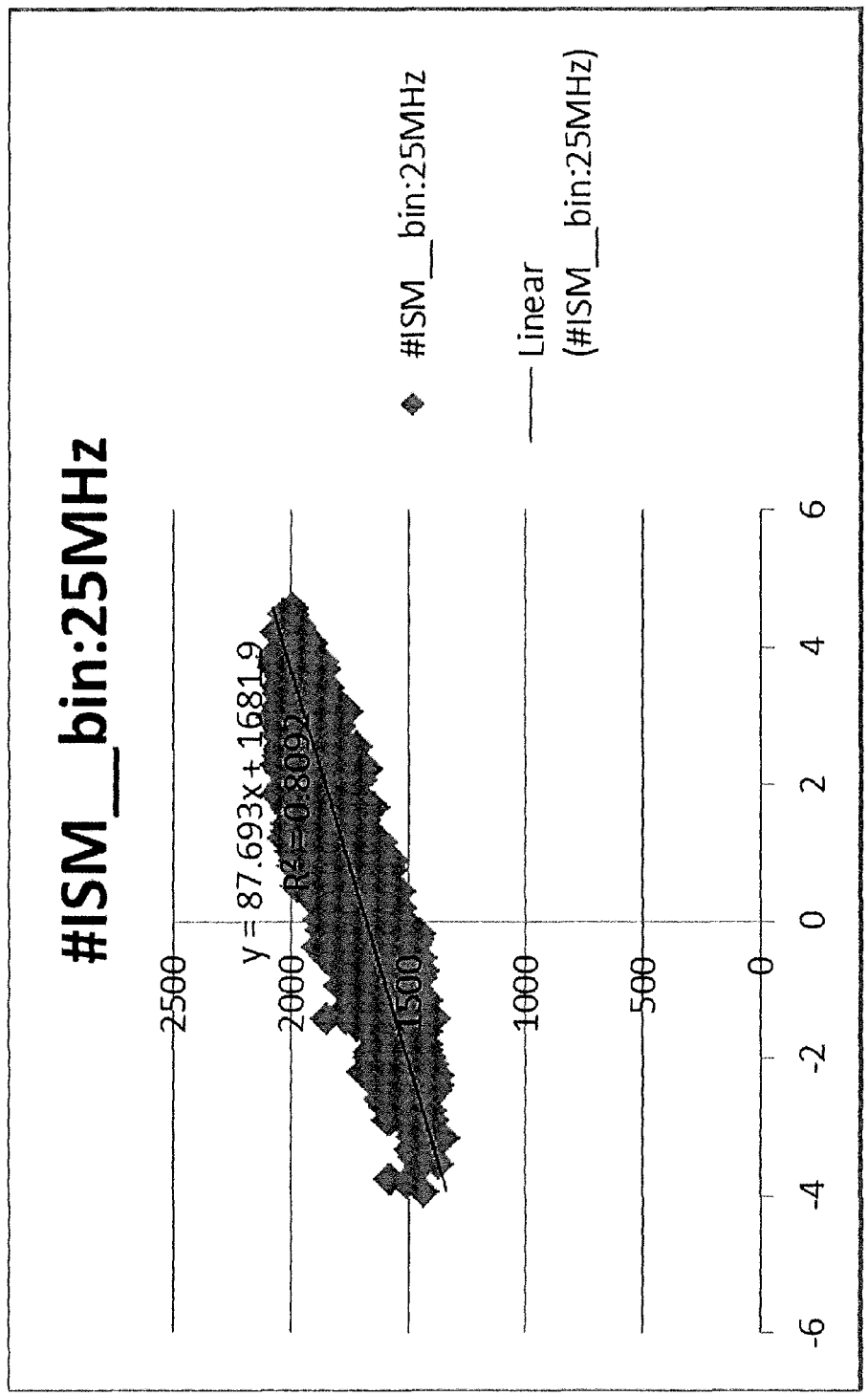
FIG. 3 is an illustration of a speed performance trend line with respect to a weighted standard deviation of WAT saturation currents.

FIG. 3 is a graph, for a sample wafer batch, illustrating the statistical relationship between the weighted standard deviation of NMOS and PMOS saturation currents of semiconductor devices and the speed performance of the ICs on a wafer. The horizontal axis represents the weighted standard deviation and the vertical axis represents the speed performance. The blue squares represent individual speed measurements for all ICs on the wafers in the batch. The black linear trend line is derived from the speed measurements and represents a speed performance model for the wafer batch as a function of the weighted standard deviation.

Figure 4:
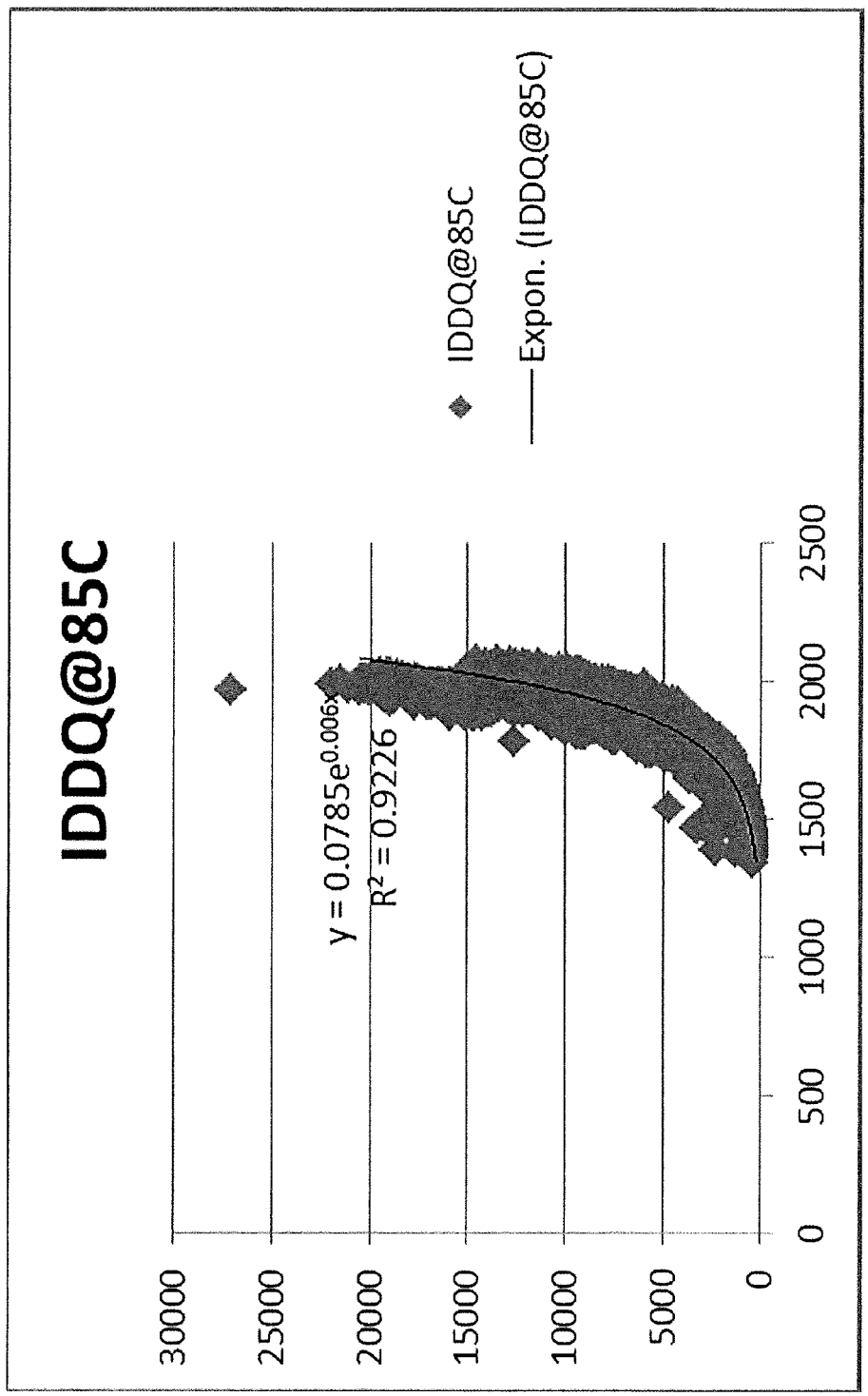
FIG. 4 is an illustration of a power performance trend line with respect to WAT speed performance.

FIG. 4 is a graph, for a sample wafer batch, illustrating the statistical relationship between the measured speed performance of the ICs on a wafer and the measured power performance of the ICs on the wafer. The horizontal axis represents the speed performance and the vertical axis represents the power performance. The blue squares represent individual power measurements for all ICs on the wafers in the batch. The black exponential trend line is derived from the power measurements and represents a power performance model. A statistical distribution is formed from the variance from and a linearization of the exponential trend line.

Those skilled in the art to which this application relates will appreciate that other and further additions, deletions, substitutions and modifications may be made to the described embodiments.

What is claimed is:

1. A wafer acceptance test (WAT) system for generating a yield forecast based on an WAT of a wafer integrated circuit (IC) batch, comprising:

a saturation current WAT subsystem operable to generate a weighted standard deviation based on target NMOS and PMOS saturation currents and saturation current WAT results;

a wafer IC speed WAT subsystem operable to generate a speed performance probability distribution of wafer ICs based on said weighted standard deviation and speed WAT results;

a wafer IC power WAT subsystem operable to employ said speed WAT results and power WAT results to generate a power performance model of wafer ICs; and a yield calculator operable to generate a power performance variance probability distribution of wafer ICs based on said power performance model and said power WAT results, and to employ said speed performance probability distribution and said power performance variance probability distribution to generate said yield forecast with respect to a target performance profile.

2. The WAT system recited in claim 1 wherein said speed performance probability distribution is further based on a linear approximation of a correlation among said saturation current WAT results and said speed WAT results.

3. The WAT system recited in claim 1 wherein said power performance model is further based on an exponential approximation of a correlation among said speed WAT results and said power WAT results.

4. The WAT system recited in claim 1 wherein said power performance variance probability distribution is further based on a logarithmic representation of said power performance model and said power WAT results.

5. The WAT system recited in claim 1 wherein said target performance profile is a desired relationship between wafer IC speed performance and wafer IC power performance.

6. The WAT system recited in claim 1 wherein said system is operable to employ said yield forecast and results of said WAT to prioritize remaining wafer processing.

7. The WAT system recited in claim 1 wherein said system is operable to employ said yield forecast and results of said WAT to validate and qualify individual wafers of said wafer IC batch.

8. A method for generating a yield forecast for a wafer batch based on an wafer acceptance test (WAT) of a plurality of semiconductor devices forming a plurality of integrated circuits (ICs) in said wafer batch, comprising:

measuring saturation currents of said plurality of semiconductor devices;

calculating weighted standard deviation of said saturation currents with respect to target NMOS and PMOS saturation currents;

measuring speed performances of said plurality of ICs and generating a speed performance model;

measuring power performances of said plurality of ICs and generating a power performance model;

projecting distributions among said plurality of ICs of speed performances and variations from said power performance model; and integrating one of said distributions about a target performance profile to generate said yield forecast.

9. The method recited in claim 8 wherein said speed performance model is a substantially linear correlation among said weighted standard deviation and said speed performances.

10. The method recited in claim 8 wherein said power performance model is a substantially exponential correlation among said speed performances and said power performances of said plurality of ICs.

11. The method recited in claim 8 wherein said projecting distributions further comprises computing a substantially linear correlation among said speed performances and said variations from said power performance model.

12. The method recited in claim 8 wherein said method is carried out during a wafer manufacturing process, and further comprises an optimizing of a remaining portion of said wafer manufacturing process based on said yield forecast.

13. The method recited in claim 8 wherein said target performance profile is a desired relationship between said speed performance and said power performance of said plurality of ICs.

14. The method recited in claim 8 wherein said integrating is of a speed performance distribution and a power performance variation distribution.

15. A system for generating a yield forecast based on an wafer acceptance test (WAT) of a wafer integrated circuit (IC) batch, comprising:

a saturation current WAT automated test equipment (ATE) operable to measure PMOS and NMOS saturation currents of semiconductor devices within an IC;

a wafer IC speed WAT ATE operable to determine speed performance of said IC;

a wafer IC power WAT ATE operable to determine power performance of said IC; and a yield calculator operable to employ said PMOS and NMOS saturation currents, said speed performance and said power performance for each IC in said wafer IC batch to generate said yield forecast, said yield calculator having:

a first program configured to generate a speed performance distribution, a second program configured to generate a power performance variance distribution, and a third program configured to employ said speed performance distribution and said power performance distribution to generate said yield forecast.

16. The system recited in claim 15 wherein said speed performance distribution is based on a linear approximation of a correlation among said saturation currents and said speed performance for each IC in said wafer IC batch.

17. The system recited in claim 15 wherein said power performance variance distribution is based on an exponential approximation of a correlation among said speed performance and said power performance of each IC in said wafer IC batch.

18. The system recited in claim 17 wherein said power performance variance distribution is further based on a logarithmic representation of said power performance variance.

19. The system recited in claim 15 wherein said yield forecast is with respect to a desired relationship between wafer IC speed performance and wafer IC power performance.

20. The system recited in claim 15 wherein said system is operable to employ said yield forecast to optimize remaining wafer processing.

* * * * *